US010435815B2

(12) United States Patent
Watanabe et al.

(10) Patent No.: US 10,435,815 B2
(45) Date of Patent: Oct. 8, 2019

(54) ORIENTED ALUMINA SUBSTRATE FOR EPITAXIAL GROWTH

(71) Applicant: NGK INSULATORS, LTD., Nagoya (JP)

(72) Inventors: Morimichi Watanabe, Nagoya (JP); Kei Sato, Tokai (JP); Kiyoshi Matsushima, Nagoya (JP); Tsutomu Nanataki, Toyoake (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 15/902,266

(22) Filed: Feb. 22, 2018

(65) Prior Publication Data

US 2018/0179664 A1   Jun. 28, 2018

Related U.S. Application Data

(63) Continuation of application No. PCT/JP2016/078265, filed on Sep. 26, 2016.

(30) Foreign Application Priority Data

| Sep. 30, 2015 | (JP) | 2015-193943 |
| Sep. 30, 2015 | (JP) | 2015-193944 |
| Nov. 16, 2015 | (JP) | 2015-224164 |
| Jan. 25, 2016 | (JP) | 2016-011190 |
| Feb. 25, 2016 | (JP) | 2016-034005 |
| Mar. 29, 2016 | (JP) | 2016-066431 |
| Jul. 14, 2016 | (JP) | 2016-139508 |

(51) Int. Cl.

| C30B 29/00 | (2006.01) |
| C30B 29/20 | (2006.01) |
| C04B 35/111 | (2006.01) |
| C30B 19/02 | (2006.01) |
| C30B 25/18 | (2006.01) |
| C30B 29/40 | (2006.01) |
| H01L 21/02 | (2006.01) |
| H01L 21/683 | (2006.01) |
| H01L 33/00 | (2010.01) |
| C30B 1/12 | (2006.01) |
| C30B 19/12 | (2006.01) |
| C30B 28/02 | (2006.01) |
| C04B 35/622 | (2006.01) |
| C04B 35/634 | (2006.01) |
| C04B 35/638 | (2006.01) |
| C04B 35/645 | (2006.01) |
| H01L 33/06 | (2010.01) |
| H01L 33/12 | (2010.01) |
| H01L 33/32 | (2010.01) |
| H01L 33/16 | (2010.01) |

(52) U.S. Cl.

CPC ............ *C30B 29/20* (2013.01); *C04B 35/111* (2013.01); *C04B 35/622* (2013.01); *C04B 35/638* (2013.01); *C04B 35/6342* (2013.01); *C04B 35/645* (2013.01); *C30B 1/12* (2013.01); *C30B 19/02* (2013.01); *C30B 19/12* (2013.01); *C30B 25/18* (2013.01); *C30B 25/183* (2013.01); *C30B 28/02* (2013.01); *C30B 29/406* (2013.01); *H01L 21/0243* (2013.01); *H01L 21/6835* (2013.01); *H01L 33/0079* (2013.01); *C04B 2235/3206* (2013.01); *C04B 2235/5292* (2013.01); *C04B 2235/60* (2013.01); *C04B 2235/6025* (2013.01); *C04B 2235/6567* (2013.01); *C04B 2235/6586* (2013.01); *C04B 2235/72* (2013.01); *C04B 2235/727* (2013.01); *C04B 2235/728* (2013.01); *C04B 2235/786* (2013.01); *C04B 2235/787* (2013.01); *H01L 21/0242* (2013.01); *H01L 21/0254* (2013.01); *H01L 21/0262* (2013.01); *H01L 21/02433* (2013.01); *H01L 33/007* (2013.01); *H01L 33/06* (2013.01); *H01L 33/12* (2013.01); *H01L 33/16* (2013.01); *H01L 33/32* (2013.01); *H01L 2221/6835* (2013.01); *H01L 2221/68345* (2013.01)

(58) Field of Classification Search

CPC ......... C30B 29/20; C30B 19/02; C30B 25/18; C30B 25/183; C04B 35/111; C01F 7/02
USPC ...................................................... 423/625
See application file for complete search history.

(56) References Cited

U.S. PATENT DOCUMENTS

| 5,549,746 A * | 8/1996 | Scott ................ C30B 29/20 117/4 |
| 2011/0039685 A1* | 2/2011 | Mao ................ C04B 35/115 501/153 |
| 2011/0059839 A1* | 3/2011 | Miyazawa ........... C04B 35/115 501/152 |

(Continued)

FOREIGN PATENT DOCUMENTS

| JP | H05-270894 A1 | 10/1993 |
| JP | 2004-359495 A1 | 12/2004 |

(Continued)

OTHER PUBLICATIONS

English translation of International Preliminary Report on Patentability (Chapter I) (Application No. PCT/JP2016/078265) dated Apr. 12, 2018, 6 pages.

(Continued)

*Primary Examiner* — Steven J Bos
(74) *Attorney, Agent, or Firm* — Burr & Brown, PLLC

(57) ABSTRACT

An oriented alumina substrate for epitaxial growth according to an embodiment of the present invention includes crystalline grains constituting a surface thereof, the crystalline grains having a tilt angle of 0.1° or more and less than 1.0° and an average sintered grain size of 10 μm or more.

8 Claims, 4 Drawing Sheets

(56) References Cited

U.S. PATENT DOCUMENTS

| | | | |
|---|---|---|---|
| 2015/0144956 A1* | 5/2015 | Watanabe | H01L 33/32 |
| | | | 257/76 |
| 2015/0179504 A1* | 6/2015 | Ide | H01L 21/76251 |
| | | | 257/506 |
| 2016/0293800 A1* | 10/2016 | Watanabe | C30B 9/10 |
| 2018/0179665 A1* | 6/2018 | Watanabe | C04B 35/111 |
| 2018/0230020 A1* | 8/2018 | Matsushima | C04B 35/115 |

FOREIGN PATENT DOCUMENTS

| | | | |
|---|---|---|---|
| JP | 5770905 B1 | | 8/2015 |
| WO | 2015/093335 A1 | | 6/2015 |
| WO | WO 2015/093335 | * | 6/2015 |

OTHER PUBLICATIONS

International Search Report and Written Opinion (Application No. PCT/JP2016/078265) dated Dec. 20, 2016.

* cited by examiner

[Multilayer body 1]     [Oriented alumina substrate 7]

ORIENTED ALUMINA SUBSTRATE FOR EPITAXIAL GROWTH

BACKGROUND OF THE INVENTION

1. Field of the Invention

The present invention relates to an oriented alumina substrate for epitaxial growth.

2. Description of the Related Art

As substrates for epitaxial growth for light-emitting devices such as light-emitting diodes (LEDs) and semiconductor devices, sapphire (single crystal α-alumina) substrates and composite substrates in which layers of semiconductor crystals such as GaN are grown on sapphire substrates are used. Substrates, for light-emitting devices, having a structure including an n-type GaN layer, multiple quantum well (MQW) layers, and a p-type GaN layer stacked, in this order, on such a substrate for epitaxial growth are mass-produced, the MQW layers including quantum well layers of InGaN layers and barrier layers of GaN layers alternately stacked.

However, sapphire substrates are generally small in area and are expensive. The inventors report the use of oriented alumina substrates in place of sapphire substrates (see PTLs 1 and 2). In PTL 1, a substrate for a light-emitting device is produced by forming a GaN seed crystal layer on an oriented alumina substrate by an MOCVD method, forming a GaN buffer layer on the seed crystal layer by a flux method, and forming a functional layer for the emission of light (including an n-type GaN layer, multiple quantum well layers, and a p-type GaN layer stacked in this order) thereon. In this specification, such a substrate for a light-emitting device, the substrate including an oriented alumina substrate serving as a constituent component, is referred to as a "substrate S1 for a device". In PTL 2, a self-supporting Ge-doped GaN substrate is produced by forming a GaN seed crystal layer on an oriented alumina substrate by an MOCVD method, forming a Ge-doped GaN layer on the seed crystal layer by a flux method, and then removing the oriented alumina substrate portion by grinding with a grindstone. A functional layer for the emission of light is formed on the self-supporting substrate to produce a substrate for a light-emitting device. In this specification, such a substrate for a light-emitting device, the substrate including a self-supporting semiconductor substrate in place of an oriented alumina substrate, is referred to as a "substrate S2 for a device".

CITATION LIST

Patent Literature

PTL 1: International Publication No. 2015/093335
PTL 2: Japanese Patent No. 5770905

SUMMARY OF THE INVENTION

Although a semiconductor device, such as a light-emitting device, produced using the substrate S1 or S2 for a device has good properties, there is a need to further improve the properties of the semiconductor device.

The present invention has been accomplished in order to solve the foregoing problem. It is a main object of the present invention to further improve the properties of the semiconductor device than ever before.

The inventors have conducted intensive studies to improve the properties of the semiconductor device such as a light-emitting device and have found that in the case where crystalline grains constituting a surface of a substrate for epitaxial growth used in producing the semiconductor device have a tilt angle of 0.1° or more and less than 1.0° and where the average sintered grain size is 10 μm or more, the semiconductor device has significantly improved properties. This finding has led to the completion of the present invention.

An oriented alumina substrate for epitaxial growth according to the present invention includes crystalline grains constituting a surface thereof, the crystalline grains having a tilt angle of 0.1° or more and less than 1.0° and an average sintered grain size of 10 μm or more. The tilt angle used here refers to the full width at half maximum of an X-ray rocking curve (XRC·FWHM). FIG. 1 is a schematic explanatory diagram of the tilt angle of alumina crystals. The average sintered grain size refers to a value measured using an image of a thermally etched surface of the oriented alumina substrate, the image being photographed with a scanning electron microscope.

In the case where the substrates S1 and S2 for devices are produced using the oriented alumina substrates for epitaxial growth according to the present invention and then semiconductor devices are produced using the substrates S1 and S2 for devices, the semiconductor devices have more improved properties than ever before. The reason for this is not clear but is presumably that the slight tilt of semiconductor grains constituting the functional layer for the emission of light results in improved light extraction efficiency and so forth. Examples of the semiconductor device include solar cells and power devices in addition to light-emitting devices. In the substrates S1 and S2 for devices, a method for forming a buffer layer and a semiconductor layer is not particularly limited. Preferred examples thereof include gas-phase methods such as a molecular beam epitaxy (MBE) method, a halide vapor-phase epitaxy (HVPE) method, and sputtering, liquid-phase methods such as a Na flux method, an ammonothermal method, a hydrothermal method, and a sol-gel method, powder methods using the solid-phase epitaxy of powders, and combinations thereof.

The present invention can also relate to an epitaxial growth method as described below. That is, the present invention can also relates to "an epitaxial growth method of epitaxially growing a semiconductor crystal on a surface of an oriented alumina substrate to form a thin film, the oriented alumina substrate including crystalline grains constituting the surface, the crystalline grains having a tilt angle of 0.1° or more and less than 1.0° and an average sintered grain size of 10 μm or more".

DETAILED DESCRIPTION OF THE INVENTION

[Oriented Alumina Substrate for Epitaxial Growth]

Figure 1:
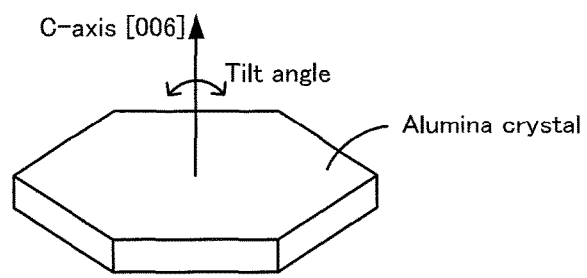
FIG. 1 is a schematic explanatory diagram of the tilt angle of alumina crystals.

An oriented alumina substrate for epitaxial growth according to an embodiment of the present invention is a polycrystalline alumina substrate. Crystalline grains that constitute a surface thereof preferably have a tilt angle of 0.1° or more and less than 1.0° and an average sintered grain size of 10 μm or more.

When the tilt angle of the crystalline grains constituting the surface is less than 0.1° or 1.0° or more, a finally produced semiconductor device does not have improved properties, which is not preferred. The reason for this is unclear but is presumably as follows: When the tilt angle is less than 0.1°, lattice defects due to the lattice mismatch between the oriented alumina substrate and an epitaxially grown film during epitaxial growth are easily left in the epitaxially grown film. When the tilt angle is 1.0° or more, for example, the light extraction efficiency of the epitaxially grown film is decreased. Furthermore, when the substrate S1 for a device is used for a light-emitting device, for example, the optical transparency of the oriented alumina substrate also seems to be decreased. The upper limit of the tilt angle is preferably less than 1.0° and more preferably 0.9° or less. The lower limit of the tilt angle is preferably 0.1° or more, more preferably 0.4° or more, even more preferably 0.6° or more, particularly preferably 0.8° or more.

When the average sintered grain size is 10 μm or more, there is no particular problem. Preferably, the average sintered grain size is 20 μm or more in view of the performance of a device such as a light-emitting device. An average sintered grain size of less than 10 μm results in a decrease in device performance and is not preferred. An excessively large average sintered grain size results in a decrease in strength. The average sintered grain size is preferably 300 μm or less, more preferably 150 μm or less, even more preferably 100 μm or less in view of handling. The upper limit and the lower limit of the average sintered grain size may be appropriately combined together among these values. From the viewpoint of achieving good device performance and handling, the average sintered grain size is preferably 10 to 300 μm, more preferably 20 to 150 μm, even more preferably 20 to 100 μm.

The oriented alumina substrate for epitaxial growth according to this embodiment preferably has a degree of c-plane orientation of 50% or more, more preferably 70% or more, even more preferably 90% or more, particularly preferably 95% or more, most preferably 100%, the degree of c-plane orientation being determined by a Lotgering method.

The thickness of the oriented alumina substrate for epitaxial growth according to the embodiment is preferably such that the substrate can be self-supported. An excessive thickness is not preferred in view of the production cost. Thus, the thickness is preferably 20 μm or more, more preferably 100 μm or more, even more preferably 100 to 1,000 μm. When a semiconductor crystal is grown on the oriented alumina substrate, the entire substrate can be warped by a stress due to the difference in thermal expansion between the oriented alumina substrate and the semiconductor crystal to adversely affect the subsequent processes. As one method for suppressing warpage, the use of a thick oriented alumina substrate may be exemplified.

When the oriented alumina substrate for epitaxial growth according to the embodiment contains impurities, the substrate is corroded and easily cracked during the production of a buffer layer and a semiconductor layer, in some cases. In particular, a high content of Na, Mg, Si, P, Ca, Fe, Ti, or Zn causes significant corrosion. The content of each of Na, Mg, Si, P, Ca, Fe, Ti, and Zn is preferably 1,500 ppm or less, more preferably 1,000 ppm or less, more preferably 500 ppm or less, more preferably 150 ppm or less, more preferably 100 ppm or less, more preferably 50 ppm or less, more preferably 10 ppm or less, in view of corrosion resistance. The lower limit thereof is not particularly set. To control the degree of orientation, the tilt angle, and the sintered grain size of the oriented alumina substrate, an oxide such as MgO, $SiO_2$, or CaO or a fluoride is added as a sintering aid, in some cases. MgO is highly effective in controlling the sintered grain size and inhibiting abnormal grain growth. In particular, when sintering is performed at a high temperature, the addition of MgO allows an oriented alumina sintered body free from abnormal grains to be produced with high yield. Thus, from the viewpoint of inhibiting the abnormal grain growth, Mg is preferably contained in an amount of 15 ppm or more (preferably 30 ppm or more, more preferably 50 ppm or more, even more preferably 100 ppm or more). Accordingly, the Mg content that achieves good corrosion resistance and production yield is preferably 15 to 1,500 ppm, more preferably 15 to 1,000 ppm, even more preferably 15 to 500 ppm, particularly preferably 30 to 150 ppm.

[Method for Producing Oriented Alumina Substrate for Epitaxial Growth]

A preferred example of a method for producing an oriented alumina substrate for epitaxial growth according to the embodiment is, but not particularly limited to, a production method including the steps of (a) forming a multilayer body in which fine-alumina-powder layers and plate-like-alumina-powder layers are alternately stacked, plate surfaces of the plate-like alumina particles being arranged along a surface of each of the fine-alumina-powder layers, and (b) sintering the multilayer body.

The fine-alumina-powder layers used in the step (a) are layers formed of the aggregate of fine alumina particles. The fine alumina powder is a powder having a smaller average particle size than the plate-like alumina powder. The fine-alumina-powder layers may be formed of the fine alumina powder itself or the fine alumina powder containing an additive. Examples of the additive include sintering aids, graphite, binders, plasticizers, dispersants, and dispersion media. Examples of a formation method include, but are not particularly limited to, tape casting, extrusion molding, casting, injection molding, and uniaxial pressing. The fine-alumina-powder layers preferably have a thickness of 5 to 100 μm, more preferably 10 to 100 μm, even more preferably 20 to 60 μm.

The plate-like alumina powder layer used in the step (a) is formed of the aggregate of plate-like alumina particles. The plate-like alumina powder preferably has a higher aspect ratio from the viewpoint of achieving higher orientation and lower tilting and preferably has an aspect ratio of 3 or more, more preferably 10 or more, even more preferably 30 or more. The aspect ratio is defined by average particle size/average thickness. Here, the average particle size is the average length of the long axes of the plate surfaces of the particles. The average thickness is the average length of the short axes of the particles. These values are determined by observing 100 freely-selected particles in the plate-like alumina powder with a scanning electron microscope (SEM). The plate-like alumina powder preferably has a larger average particle size from the viewpoint of achieving higher orientation and lower tilting of an oriented sintered body and preferably has an average particle size of 1.5 µm or more, more preferably 5 µm or more, even more preferably 10 µm or more, particularly preferably 15 µm or more. However, the plate-like alumina powder preferably has a smaller average particle size in view of densification and preferably has an average particle size of 30 µm or less. To achieve high orientation and densification, the plate-like alumina powder preferably has an average particle size of 1.5 to 30 µm. The plate-like alumina powder preferably has a larger average thickness than the fine alumina powder from the viewpoint of achieving higher orientation and lower tilting. The plate-like alumina powder layer may be formed of the plate-like alumina powder itself or the plate-like alumina powder containing an additive. Examples of the additive include sintering aids, graphite, binders, plasticizers, dispersants, and dispersion media. In the plate-like alumina powder layer, the plate surfaces of plate-like alumina particles contained in the plate-like alumina powder are arranged along a surface of each of the fine-alumina-powder layers. The plate-like alumina powder is preferably formed of single particles. If the plate-like alumina powder is not formed of single particles, the degree of orientation and the tilt angle may be degraded. The fact that the plate-like alumina powder is formed of single particles is very important from the viewpoint of achieving a lower tilt angle. To form single particles, at least one of classification treatment, disintegration treatment, and elutriation treatment may be employed. Preferably, all the treatments are employed. The classification treatment and the disintegration treatment are preferably employed when, for example, particles are aggregated. An example of the classification treatment is air classification. Examples of the disintegration treatment include pot disintegration and wet atomization processes. The elutriation treatment is preferably employed when fine particle powder is contained.

The multilayer body formed in the step (a) is one in which the fine-alumina-powder layers and the plate-like-alumina-powder layers are alternately stacked. From the viewpoint of achieving lower tilting, preferably, the multilayer body is formed as follows: One surface of each of compacts of the fine alumina powder is entirely or partially covered with a plate-like-alumina-powder layer to form a one-surface processed body. The multilayer body is formed using the one-surface processed bodies. Alternatively, both surfaces of each of compacts of the fine alumina powder are entirely or partially covered with plate-like-alumina-powder layers to form a two-surface processed body. The multilayer body is formed using the two-surface processed bodies and the unprocessed compacts.

The one-surface processed body or the two-surface processed body may be formed by stacking the compact of the plate-like alumina powder on one or both surfaces of the compact of the fine alumina powder, the compact of the plate-like alumina powder having a smaller thickness than the compact of the fine alumina powder. In this case, the compact of the plate-like alumina powder may be formed by, for example, tape casting or printing while a shear force is applied in such a manner that the plate surfaces of the plate-like alumina particles are arranged along the surface of the compact. Alternatively, the one-surface processed body or the two-surface processed body may be formed by applying a dispersion of the plate-like alumina powder to one or both surfaces of the compact of the fine alumina powder using printing, spray coating, spin coating, or dip coating. In the case of the spray coating, spin coating, and the dip coating, the plate surfaces of the plate-like alumina particles are arranged along the surface of the compact without forcibly applying the shear force. Regarding the plate-like alumina particles arranged on the surface of the compacts, although several plate-like alumina particles may overlap with each other, preferably, the plate-like alumina particles do not overlap with each other.

In the case where the one-surface processed bodies are used, the one-surface processed bodies may be stacked in such a manner that the fine-alumina-powder layers and the plate-like-alumina-powder layers are alternately stacked. In the case where the two-surface processed bodies are used, the two-surface processed bodies and the unprocessed compacts of the fine alumina powder may be alternately stacked. The multilayer body may be formed using both of the one-surface processed bodies and the two-surface processed bodies. The multilayer body may be formed using the one-surface processed bodies, the two-surface processed bodies, and the unprocessed compacts.

In the step (b), the multilayer body is sintered. In this case, a sintering method is not particularly limited. Preferably, the multilayer body is subjected to pressure sintering. Examples of the pressure sintering include hot-pressing sintering and HIP sintering.

Figure 2:
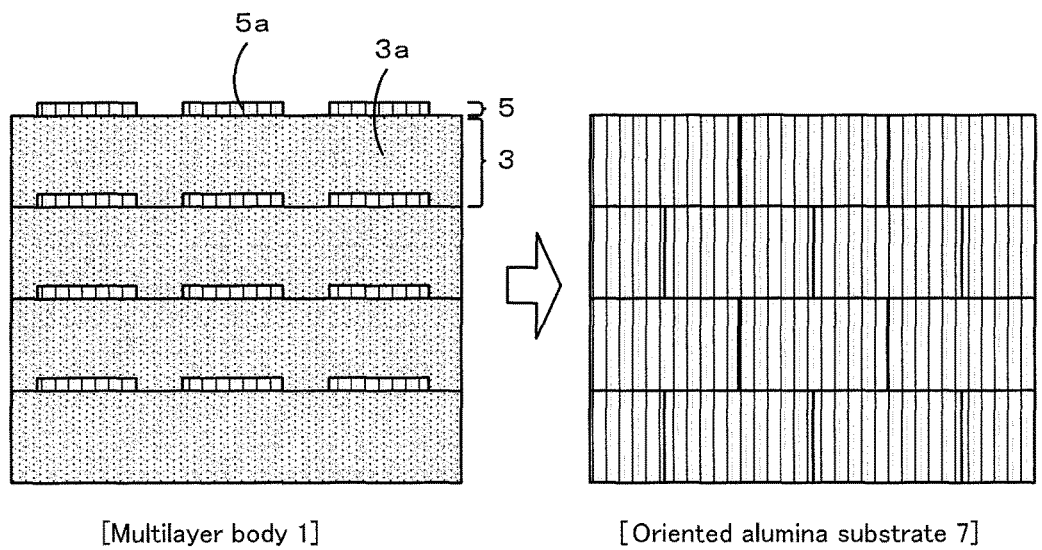
FIG. 2 is a schematic diagram illustrating a step of sintering a multilayer body 1 to produce an oriented alumina substrate 7.

Pressureless pre-sintering may be performed before the pressure sintering. When the HIP sintering is performed, a capsule method may be employed. In the case of the hot-pressing sintering, the pressure is preferably 50 kgf/cm$^2$ or more, more preferably 200 kgf/cm$^2$ or more. In the case of the HIP sintering, the pressure is preferably 1,000 kgf/cm$^2$ or more, more preferably 2,000 kgf/cm$^2$ or more. The sintering atmosphere is not particularly limited. An inert gas atmosphere such as air, nitrogen, or Ar or a vacuum atmosphere is preferred. A nitrogen or Ar atmosphere is particularly preferred. A nitrogen atmosphere is most preferred. The sintering temperature (maximum temperature) is preferably higher to the extent that abnormal grain growth or melting does not occur. The sintering temperature is preferably 1,700° C. to 2,050° C., more preferably 1,800° C. to 2,000° C., even more preferably 1,900° C. to 2,000° C. FIG. 2 is a schematic diagram illustrating a step of sintering a multilayer body 1 to produce an oriented alumina substrate 7. As illustrated in FIG. 2, the multilayer body 1 includes fine-alumina-powder layers 3 that are formed of the aggregate of fine alumina particles 3a and plate-like-alumina-powder layers 5 in which the plate surfaces of plate-like alumina particles 5a are arranged along the surfaces of the fine-alumina-powder layers 3, the fine-alumina-powder layers 3 and the plate-like-alumina-powder layers 5 being alternately stacked. When the multilayer body 1 is sintered, the plate-like alumina particles 5a are formed into seed crystals (template), the fine alumina particles 3a are formed into a matrix, and the template is homoepitaxially grown while taking in the matrix. This results in the oriented alumina substrate 7 having a high degree of orientation and a small tilt angle as a sintered body. The degree of orientation and the tilt angle depend on the particle size and the aspect ratio of the plate-like alumina powder, the difference between the thickness of the plate-like alumina powder and the particle size of the fine alumina powder, the aggregation state of the plate-like alumina particles, the overlapping state of the plate-like alumina particles in the plate-like-alumina-powder layers, sintering conditions, and the surface coverage of the fine-alumina-powder layers with the plate-like alumina powder. By appropriately controlling these factors, the oriented alumina substrate having a high degree of orientation and a tilt angle of 0.1° or more and less than 1° can be produced. A coverage of 1% to 60% (preferably 1% to 20%, more preferably 3% to 20%) results in a high degree of orientation and a small tilt angle. Regarding the degree of orientation and the tilt angle, a thickness of each fine-alumina-powder layer of 5 to 100 µm (preferably 10 to 100 µm, more preferably 20 to 60 µm) results in a high degree of orientation and a small tilt angle. Here, the degree of orientation indicates the degree of c-plane orientation determined by a Lotgering method using an X-ray diffraction profile.

[Substrate S1 for Device and Light-Emitting Device 30 Using the Same]

Figure 3:
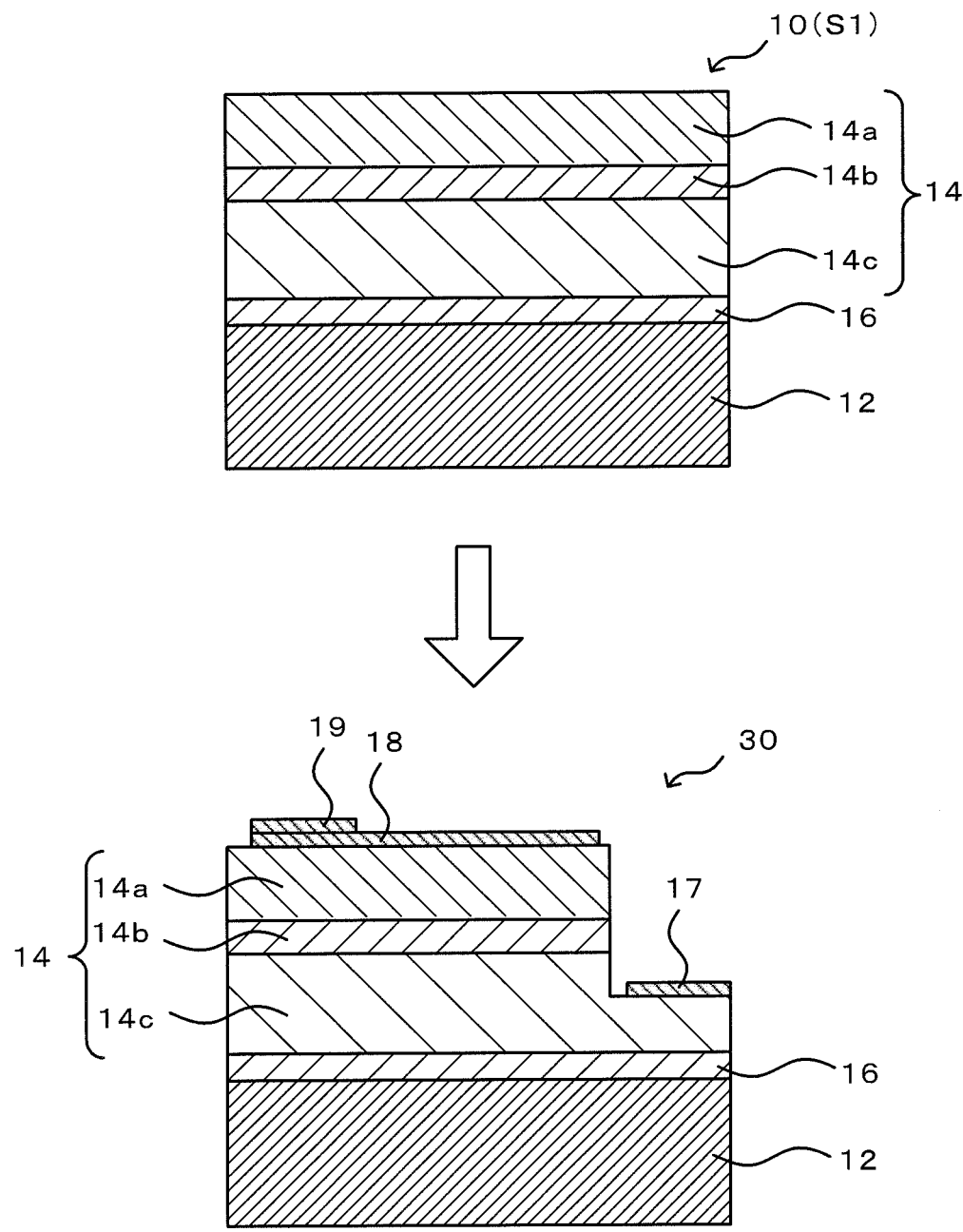
FIG. 3 is a cross-sectional view illustrating a step of producing a light-emitting device 30 from a substrate 10 for a light-emitting device.

The substrate S1 for a device is a substrate for a light-emitting device including an oriented alumina substrate as a constituent element. The top of FIG. 3 is a cross-sectional view of a substrate 10 for a light-emitting device, the substrate 10 being an example of the substrate S1 for a device. In the substrate 10 for a light-emitting device, a functional layer for the emission of light 14 is arranged on a buffer layer 16 arranged on an oriented alumina substrate 12. The functional layer for the emission of light 14 is a composite layer in which an n-type layer 14c, an active layer 14b, and a p-type layer 14a are stacked in this order from the buffer layer 16. Each layer included in the functional layer for the emission of light 14 is composed of a material mainly containing a semiconductor material. Examples of the semiconductor material include GaN-based materials, ZnO-based materials, and AlN-based materials. Of these, GaN-based materials are preferred. The n-type layer 14c contains a semiconductor material doped with an n-type dopant. The p-type layer 14a contains a semiconductor material doped with a p-type dopant. The active layer 14b is formed of multiple quantum well layers in which quantum well layers and barrier layers are alternately stacked. In the case where a GaN-based material is used as a semiconductor material, the quantum well layers may be InGaN layers, and the barrier layers may be GaN layers. The buffer layer 16 serves to reduce lattice defects due to a lattice mismatch between the oriented alumina substrate 12 and the functional layer for the emission of light 14 and thus to improve crystallinity. The buffer layer 16 preferably has the same crystal structure as the functional layer for the emission of light 14 or has high crystallinity similar to the functional layer for the emission of light 14. The buffer layer 16 may have a lattice constant identical or close to the functional layer for the emission of light 14. The buffer layer 16 has a structure grown so as to have the same crystal orientation as the oriented alumina substrate 12. The buffer layer 16 is preferably composed of the foregoing semiconductor material as a main component and may appropriately contain a dopant so as to have a p- or n-conductivity type.

For example, the substrate 10 for a light-emitting device can be produced as follows: A semiconductor crystal such as GaN is epitaxially grown on the oriented alumina substrate 12 to form a semiconductor layer (buffer layer 16). In this case, a semiconductor crystal is epitaxially grown on the oriented alumina substrate 12 to form a semiconductor thin film (seed crystal layer). Furthermore, the same semiconductor crystal is epitaxially grown on the semiconductor thin film to form a film thicker than the semiconductor thin film. Both of the films may be used as the semiconductor layer. The epitaxial growth may be performed in any of gas, liquid, and solid phases. Next, the n-type layer 14c, the active layer 14b, and the p-type layer 14a are sequentially stacked on the buffer layer 16 to form the functional layer for the emission of light 14, thereby providing the substrate 10 for a light-emitting device.

The light-emitting device 30 may be produced as described below using the substrate 10 for a light-emitting device. FIG. 3 is a cross-sectional view illustrating a step of forming the light-emitting device 30. A portion of the n-type layer 14c is exposed on the side of the functional layer for the emission of light 14 of the substrate 10 for a light-emitting device. A cathode electrode 17 is formed on the exposed portion of the n-type layer 14c. An optical translucent anode electrode 18 is formed on the upper surface of the p-type layer 14a. An anode electrode pad 19 is formed thereon. After the formation of the electrodes, the substrate 10 for a light-emitting device is cut into a chip. The chip is mounted on a lead frame to provide the light-emitting device 30 having a horizontal structure.

A light-emitting device having a vertical structure may also be produced using the substrate 10 for a light-emitting device. For example, an anode electrode is formed on the upper surface of the p-type layer 14a of the substrate 10 for a light-emitting device. The anode electrode is joined to a mount board. The oriented alumina substrate 12 is removed by a laser lift-off process. A cathode electrode is formed on the exposed surface of the n-type layer 14c to provide the light-emitting device. When the oriented alumina substrate 12 is removed by the laser lift-off process, the buffer layer 16 may also be removed.

[Substrate S2 for Device and Light-Emitting Device 40 Using the Same]

Figure 4:
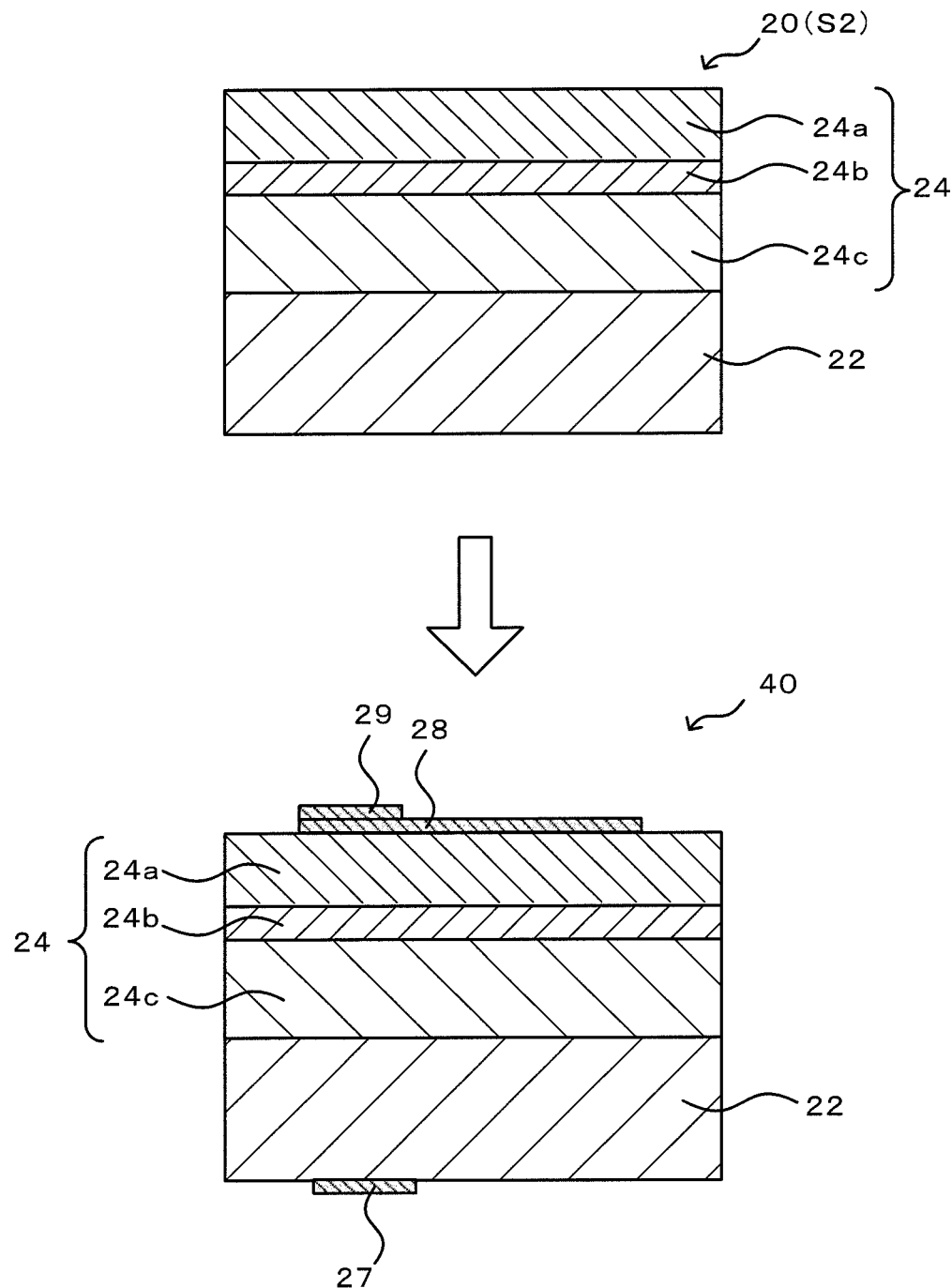
FIG. 4 is a cross-sectional view illustrating a step of producing a light-emitting device 40 from the substrate 20 for a light-emitting device.

The substrate S2 for a device is a substrate for a light-emitting device, the substrate including a self-supporting semiconductor substrate, serving as a constituent element, in place of the oriented alumina substrate of the substrate S1 for a device. The top of FIG. 4 is a cross-sectional view of a substrate 20 for a light-emitting device, the substrate 20 being an example of the substrate S2 for a device. In the substrate 20 for a light-emitting device, a functional layer for the emission of light 24 is arranged on a self-supporting semiconductor substrate 22. The functional layer for the emission of light 24 is a composite layer in which an n-type layer 24c, an active layer 24b, and a p-type layer 24a are stacked. Because the functional layer for the emission of light 24 is basically identical to the functional layer for the emission of light 14 described above, descriptions are omitted. The self-supporting semiconductor substrate 22 illustrated in FIG. 4 is a semiconductor material doped with an n-type dopant; however, the self-supporting semiconductor substrate 22 may be an undoped semiconductor material. The use of a substrate composed of gallium nitride having electrical conductivity obtained by the incorporation of an n-type dopant can provide a light-emitting device having a vertical structure.

For example, the substrate 20 for a light-emitting device can be produced as follows: A semiconductor crystal such as GaN is epitaxially grown on an oriented alumina substrate to form a semiconductor layer. In this case, a semiconductor crystal is epitaxially grown on the oriented alumina substrate to form a semiconductor thin film (seed crystal layer). Furthermore, the same semiconductor crystal is epitaxially grown on the semiconductor thin film to form a film thicker than the semiconductor thin film. Both of the films may be used as the semiconductor layer. The epitaxial growth may be performed in any of gas, liquid, and solid phases. Next, the oriented alumina substrate is removed by a method such as grinding processing to provide the semiconductor layer alone, i.e., the self-supporting semiconductor substrate 22.

The n-type layer 24c, the active layer 24b, and the p-type layer 24a are sequentially stacked on the self-supporting semiconductor substrate 22 to form the functional layer for the emission of light 24, thereby providing the substrate 20 for a light-emitting device.

The light-emitting device 40 may be produced as described below using the substrate 20 for a light-emitting device. FIG. 4 is a cross-sectional view illustrating a step of forming the light-emitting device 40. A cathode electrode 27 is formed on a portion of the substrate 20 for a light-emitting device on the side of the self-supporting semiconductor substrate 22. An optical translucent anode electrode 28 is formed on the p-type layer 24a. An anode electrode pad 29 is formed thereon. After the formation of the electrodes, the substrate 20 for a light-emitting device is cut into a chip. The chip is mounted on a lead frame to provide the light-emitting device 40.

The present invention is not limited to the foregoing embodiments. It will be obvious that various modifications may be made within the technical scope of the present invention.

EXAMPLES

Examples A1 to A6 described below are production examples of epitaxially oriented alumina substrates. Examples B1 to B6 are production examples of the substrates S1 for devices and light-emitting devices using the substrates S1. Examples C1 to C6 are production examples of the substrates S2 for devices and light-emitting devices using the substrates S2.

Experimental Example A1

(1) Production of Oriented Alumina Substrate
(1a) Production of Multilayer Body

First, 0.0125 parts by mass (125 ppm by mass) of magnesium oxide (500A, available from Ube Material Industries, Ltd.), 7.8 parts by mass of poly vinyl butyral (item No. BM-2, available from Sekisui Chemical Co., Ltd.) serving as a binder, 3.9 parts by mass of di(2-ethylhexyl) phthalate (available from Kurogane Kasei Co., Ltd.) serving as a plasticizer, 2 parts by mass of sorbitan trioleate (Rheodol SP-O30, available from Kao Corporation) serving as a dispersant, and 2-ethylhexanol serving as a dispersion medium were added to and mixed with 100 parts by mass of a fine alumina powder (grade: TM-DAR, available from Taimei Chemicals Co., Ltd). The amount of the dispersion medium was adjusted in such a manner that the resulting slurry had a viscosity of 20,000 cP. The slurry prepared as described above was formed by a doctor blade method into a sheet having a dry thickness of 40 µm on a PET film, thereby forming a fine-alumina-powder layer.

A commercially available plate-like alumina powder (grade: YFA10030, available from Kinsei Matec Co., Ltd.) was classified with an air classifier (TC-15N, available from Nisshin Engineering Inc.) at a cut-off point of 3 µm. The classified powder was subjected to disintegration with a pot disintegrator using balls having a diameter of 0.3 mm for 20 hours. A fine powder was then removed by elutriation. To 100 parts by mass of the resulting plate-like alumina powder, 500 parts by mass of isopropyl alcohol serving as a dispersion medium was added. The resulting dispersion (plate-like alumina slurry) was dispersed with an ultrasonic disperser for 5 minutes and then sprayed on one surface of the fine-alumina-powder layer with a spray gun (Spray-Work HG Wide Airbrush, available from Tamiya, Inc.) at a spray pressure of 0.2 MPa and a spray distance of 20 cm, thereby forming a one-surface processed body. In this case, the surface coverage of the fine-alumina-powder layer with the plate-like alumina powder was 1%. The coverage of the one-surface processed body was calculated as follows: The surface of the fine-alumina-powder layer was observed with an optical microscope. An observation photograph of the surface was subjected to image processing to distinguish a portion of the plate-like alumina powder from the other portion. The proportion of the area of the plate-like alumina powder to the area of the surface of the fine-alumina-powder layer in the observation photograph was defined as the coverage.

The resulting one-surface processed body was cut into circles having a diameter of 50 mm and peeled from the PET film. Then 65 layers were stacked in such a manner that the processed surfaces that had been sprayed were not superposed on each other. The resulting stack was placed on an Al plate having a thickness of 10 mm and then placed in a package. The package was vacuumized to form a vacuum package. The vacuum package was subjected to isostatic pressing at a pressure of 100 kgf/cm$^2$ in a hot water having a temperature of 85° C., thereby providing a multilayer body.

(1b) Sintering of Multilayer Body

The resulting multilayer body was placed in a degreasing furnace and degreased at 600° C. for 10 hours. The degreased body was sintered by hot pressing with a graphite die set at a sintering temperature (maximum temperature) of 1,975° C. for 4 hours at a surface pressure of 200 kgf/cm$^2$ in nitrogen, thereby forming an alumina sintered body. When the temperature was lowered from the sintering temperature, the pressing pressure was maintained until the temperature reached 1,200° C. At temperatures lower than 1,200° C., the pressing pressure was zero.

(1c) Production of Oriented Alumina Substrate

The resulting sintered body as described above was fixed to a ceramic surface plate and ground with a grindstone of #2,000 to flatten the surface. The surface was smoothed by lapping with a diamond abrasive to provide an oriented alumina sintered body having a diameter of 50 mm and a thickness of 0.5 mm and serving as an oriented alumina substrate. The surface smoothness was improved by reducing the size of the abrasive grains from 3 µm to 0.5 µm in a stepwise manner. The average roughness Ra after the lapping was 4 nm.

(2) Properties of Oriented Alumina Substrate
(2a) Degree of c-Plane Orientation

To examine the degree of orientation of the oriented alumina substrate, the upper surface of the oriented alumina substrate was polished in such a manner that the resulting polished surface was parallel to the upper surface. The polished surface was irradiated with X-ray to measure the degree of c-plane orientation. An XRD profile was measured with an XRD apparatus (RINT-TTR III, available from Rigaku Corporation) in the 2θ range of 20° to 70°. Specifically, the measurement was performed using CuKα radiation at a voltage of 50 kV and a current of 300 mA. The degree of c-plane orientation was calculated by the Lotgering method. Specifically, the degree of c-plane orientation was calculated from a formula described below. In the formula, P represents a value obtained from the XRD profile of the oriented alumina substrate, and P0 represents a value calculated form reference α-alumina (JCPDS card No. 46-1212). The degree of c-plane orientation of the oriented alumina substrate of Experimental example 1 was 100%.

$$\text{degree of } c\text{-plane orientation } [\%] = \frac{p - p_0}{1 - p_0} \times 100 \quad [\text{Math 1}]$$

$$p_0 = \frac{I_0(006)}{\sum I_0(hkl)}$$

$$p = \frac{I_s(006)}{\sum I_s(hkl)}$$

$I_0$ (hkl) and $I_s$ (hkl) represent integral values of diffraction intensities of the (hkl) plane in ICDD No. 461212 and the sample, respectively, (2θ=20°-70°)

(2b) Tilt Angle

Figure 5:
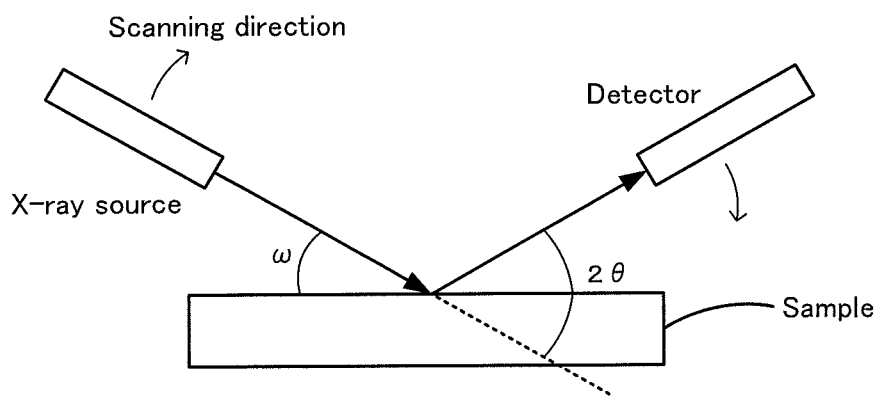
FIG. 5 is an explanatory diagram illustrating rocking curve measurement.

The tilt angle indicates the distribution of tilt of the crystal axis and serves as a parameter to evaluate how often the crystal orientation of alumina is tilted from the c-axis. Here, the tilt angle is represented by the full width at half maximum of an X-ray rocking curve (XRC·FWHM). The XRC·FWHM was measured by scanning the surface of the oriented alumina substrate (the same surface subjected to the measurement of the degree of c-plane orientation) with an X-ray source and a detector in a ganged manner as illustrated in FIG. 5 and measuring the full width at half maximum of the resulting curve. The measurement method as described above is what is called rocking curve measurement in which the value of 2θ (angle between the detector and the incident X-ray) is fixed to a diffraction peak position and only ω (angle between the surface of the sample substrate and the incident X-ray) is scanned. A RINT-TTR III (available from Rigaku Corporation) was used as an instrument. The scan range of ω was 3.80 to 38.8° using CuKα radiation at a voltage of 50 kV and a current of 300 mA. The XRC·FWHM of the oriented alumina substrate of Experimental example 1 was 0.90°.

(2c) Evaluation of Grain Size of Oriented Alumina Substrate

Regarding the sintered grains of the oriented alumina substrate, the average sintered grain size on the surface was measured by the following method: The resulting oriented alumina substrate was thermally etched at 1,550° C. for 45 minutes. Then an image thereof was captured with a scanning electron microscope. The range of the field of view was set in such a manner that when diagonals were drawn on the resulting image, each of the diagonals intersected with 10 to 30 grains. The average sintered grain size of the surface was determined by multiplying the average length of segments in all grains intersecting with two diagonals drawn on the image by 1.5. The average sintered grain size of the surface was 66 μm.

(2d) Amount of Impurity in Oriented Alumina Substrate

After the alumina sintered body was pulverized with an alumina mortar with a purity of 99.9% by mass, quantitative analysis was performed by a method described below. The proportions by mass (ppm) of Na, Mg, Si, P, Ca, Fe, Ti, and Zn in the alumina sintered body were determined. Impurity elements other than Mg in the alumina sintered body of Experimental example 1 were not detectable, and 62 ppm of Mg was detected.

Method for quantitatively determining impurities: the plate-like alumina powder was dissolved using a method of decomposition by sulfuric acid in a pressure vessel according to JIS R1649 and analyzed with an induction coupled plasma (ICP) emission spectrometer (PS3520UV-DD, available from Hitachi High-Tech Science Corporation). Table 1 summarizes the sintering method, the sintering temperature, and the properties of the oriented alumina substrate in Experimental example A1.

TABLE 1

| | | | Properties of oriented alumina substrate | | | | | | | | | | |
|---|---|---|---|---|---|---|---|---|---|---|---|---|---|
| Experimental example | Sintering method | Sintering temperature [° C.] | C-plane orientation [%] | XRC· FWHM [°] | Average grain Size [μm] | Content of impurity (ppm)*[1] | | | | | | | |
| | | | | | | Na | Mg | Si | P | Ca | Fe | Ti | Zn |
| A1 | Hot pressing | 1975 | 100 | 0.9 | 66 | N.D. | 62 | N.D. | N.D. | N.D. | N.D. | N.D. | N.D. |
| A2 | Hot pressing | 1975 | 100 | 0.9 | 86 | N.D. | 61 | N.D. | N.D. | N.D. | N.D. | N.D. | N.D. |
| A3 | Hot pressing | 1900 | 100 | 0.98 | 21 | N.D. | 62 | N.D. | N.D. | N.D. | N.D. | N.D. | N.D. |
| A4 | Hot pressing | 1975 | 100 | 2.2 | 46 | N.D. | 65 | N.D. | N.D. | N.D. | N.D. | N.D. | N.D. |
| A5 | Hot pressing | 1400 | 100 | 0.8 | 8 | N.D. | N.D. | N.D. | N.D. | N.D. | N.D. | N.D. | N.D. |
| A6 | Hot pressing | 1975 | 100 | 0.07 | 48 | N.D. | 65 | N.D. | N.D. | N.D. | N.D. | N.D. | N.D. |
| A7 | Hot pressing | 1975 | 100 | 0.6 | 80 | N.D. | 62 | N.D. | N.D. | N.D. | N.D. | N.D. | N.D. |
| A8 | Hot pressing | 1975 | 100 | 0.4 | 62 | N.D. | 62 | N.D. | N.D. | N.D. | N.D. | N.D. | N.D. |
| A9 | Hot pressing | 1975 | 100 | 0.8 | 62 | N.D. | 62 | N.D. | N.D. | N.D. | N.D. | N.D. | N.D. |

*[1]"N.D." means below the detection limit.

Experimental Example A2

An oriented alumina substrate was produced as in Experimental example A1, except that a plate-like alumina powder prepared in our company was used unlike Experimental example A1. The properties thereof were measured. Table 1 lists the properties of the oriented alumina substrate.

The plate-like alumina powder prepared in our company was prepared as follows: First, 96 parts by mass of high-purity γ-alumina (TM-300D, available from Taimei Chemicals Co., Ltd.), 4 parts by mass of high-purity AlF$_3$ (high grade, available from Kanto Chemical Co., Inc.), 0.17 parts by mass of high-purity α-alumina (TM-DAR, available from Taimei Chemicals Co., Ltd., D50=1 μm) serving as seed crystals, and isopropyl alcohol (IPA) serving as a solvent were mixed together using a pot mill with alumina balls having a diameter of 2 mm for 5 hours. The total proportion of impurity elements other than F, H, C, and S in the resulting powder mixture was 1,000 ppm or less. Next, 300 g of the resulting raw-material powder mixture was placed in a sagger (volume: 750 cm$^3$) composed of high-purity alumina having a purity of 99.5% by mass, covered with a lid composed of high-purity alumina having a purity of 99.5% by mass, and heat-treated at 900° C. for 3 hours in an electric furnace under an air stream. The flow rate of air was 25,000 cc/min. The heat-treated powder was annealed at 1,150° C. for 40 hours in air and then pulverized with alumina balls having a diameter of 2 mm for 4 hours to provide a plate-like alumina powder having an average particle size of 2 μm, an average thickness of 0.2 μm, and an aspect ratio of 10. The average particle size and the average thickness of the particles were determined by observing freely-selected 100 particles in the plate-like alumina powder with a scanning electron microscope (SEM). The average particle size refers to the average length of the long axes of the particles. The average thickness refers to the average length of the short axes of the particles. The aspect ratio refers to average particle size/average thickness. The resulting plate-like alumina powder was composed of α-alumina.

Experimental Example A3

An oriented alumina substrate of Experimental example A3 was produced as in Experimental example A1, except that the sintering temperature was 1,900° C. The properties thereof were measured. Table 1 lists the properties of the oriented alumina substrate.

Experimental Example A4

First, 0.0125 parts by mass (125 ppm by mass) of magnesium oxide (500A, available from Ube Material Industries, Ltd.), 7.8 parts by mass of poly vinyl butyral (item No. BM-2, available from Sekisui Chemical Co., Ltd.) serving as a binder, 3.9 parts by mass of di(2-ethylhexyl) phthalate (available from Kurogane Kasei Co., Ltd.) serving as a plasticizer, 2 parts by mass of sorbitan trioleate (Rheodol SP-O30, available from Kao Corporation) serving as a dispersant, and 2-ethylhexanol serving as a dispersion medium were added to and mixed with 100 parts by mass of a fine alumina powder (grade: TM-DAR, available from Taimei Chemicals Co., Ltd). The amount of the dispersion medium was adjusted in such a manner that the resulting slurry had a viscosity of 20,000 cP. The slurry prepared as described above was formed by a doctor blade method into a sheet having a dry thickness of 40 μm on a PET film, thereby forming a fine-alumina-powder layer.

Next, 50 parts by mass of poly vinyl butyral (item No. BM-2, available from Sekisui Chemical Co., Ltd.) serving as a binder, 25 parts by mass of di(2-ethylhexyl) phthalate (available from Kurogane Kasei Co., Ltd.) serving as a plasticizer, 2 parts by mass of sorbitan trioleate (Rheodol SP-O30, available from Kao Corporation) serving as a dispersant, and a xylene-1-butanol (mixing ratio: 1:1) solution mixture serving as a dispersion medium were added to and mixed with 100 parts by mass of a commercially available plate-like alumina powder (grade: YFA10030, available from Kinsei Matec Co., Ltd). The amount of the dispersion medium was adjusted in such a manner that the resulting slurry had a 5,000 cP. The slurry prepared as described above was formed by a reverse doctor blade method into a sheet having a dry thickness of 3 μm, thereby forming a plate-like-alumina-powder layer.

Each of the fine-alumina-powder layer and the plate-like-alumina-powder layer was cut into circles having a diameter of 50 mm and peeled form the PET film. Then 50 fine-alumina-powder layers and 50 plate-like-alumina-powder layers were alternately stacked. The resulting stack was placed on an A1 plate having a thickness of 10 mm and then placed in a package. The package was vacuumized to form a vacuum package. The vacuum package was subjected to isostatic pressing at a pressure of 100 kgf/cm$^2$ in a hot water having a temperature of 85° C., thereby providing a multilayer body. In this case, the surface coverage of the fine-alumina-powder layer with the plate-like-alumina-powder layer was 60%.

The resulting multilayer body was degreased, sintered, and processed in the same ways as in Experimental example A1 to produce an oriented alumina substrate. The properties thereof were measured. Table 1 lists the properties of the oriented alumina substrate.

Experimental Example A5

First, 99.8 parts by mass of a fine alumina powder (grade: TM-DAR, available from Taimei Chemicals Co., Ltd.) was mixed with 0.2 parts by mass of an yttria powder (grade: UU, available from Shin-Etsu Chemical Co., Ltd). Water was added as a solvent in an amount of 50 cc per 100 g of the powder mixture. The mixture was pulverized with a ball mill for 40 hours to prepare a slurry. The slurry was cast by pouring the slurry into a plaster mold having an inside diameter of 50 mm and then placing the slurry in a magnetic field of 12 T for 3 hours. The formed body was removed from the plaster mold, dried at room temperature, and sintered by hot pressing with a graphite die set at 1,400° C. for 4 hours at a surface pressure of 200 kgf/cm$^2$ in nitrogen. The resulting sintered body was processed as in Experimental example A1 to produce an oriented alumina substrate. The properties thereof were measured. Table 1 lists the properties of the oriented alumina substrate.

Experimental Example A6

A commercially available plate-like alumina powder (grade: YFA10030, available from Kinsei Matec Co., Ltd.) was classified with an air classifier (TC-15N, available from Nisshin Engineering Inc.) at a cut-off point of 3 μm. The classified powder was subjected to disintegration with a pot disintegrator using balls having a diameter of 0.3 mm for 20 hours. A fine powder was then removed by elutriation. Next, 0.5 parts by mass of the resulting plate-like alumina powder was mixed with 99.5 parts by mass of a fine alumina powder (grade: TM-DAR, available from Taimei Chemicals Co., Ltd). Then 0.0125 parts by mass (125 ppm by mass) of magnesium oxide (500A, available from Ube Material Industries, Ltd.) was mixed therewith with respect to 100 parts by mass of the powder mixture to prepare a powder formulation. Water was added as a solvent in an amount of 50 cc per 100 g of the powder formulation. The mixture was pulverized with a ball mill for 40 hours to prepare a slurry. The slurry was cast by pouring the slurry into a plaster mold having an inside diameter of 50 mm and then placing the slurry in a magnetic field of 12 T for 3 hours. The formed body was removed from the plaster mold, dried at room temperature, and sintered by hot pressing with a graphite die set at 1,975° C. for 4 hours at a surface pressure of 200 kgf/cm$^2$ in nitrogen. The resulting sintered body was processed as in Experimental example A1 to produce an oriented alumina substrate. The properties thereof were measured. Table 1 lists the properties of the oriented alumina substrate.

Experimental Example A7

First, 0.0125 parts by mass (125 ppm by mass) of magnesium oxide (500A, available from Ube Material Industries, Ltd.) was mixed with 100 parts by mass of a fine alumina powder (grade: AKP-3000, available from Sumitomo Chemical Co., Ltd). Water was added as a solvent in an amount of 50 cc per 100 g of the powder mixture. The mixture was pulverized with a ball mill for 40 hours to prepare a slurry. The slurry was cast by pouring the slurry into a plaster mold having an inside diameter of 50 mm and then placing the slurry in a magnetic field of 10 T for 3 hours. The formed body was removed from the plaster mold, dried at room temperature, and sintered by hot pressing with a graphite die set at 1,975° C. for 4 hours at a surface pressure of 200 kgf/cm$^2$ in nitrogen. The resulting sintered body was processed as in Experimental example A1 to produce an oriented alumina substrate. The properties thereof were measured. Table 1 lists the properties of the oriented alumina substrate.

Experimental Example A8

An alumina sintered body was produced as in Experimental example A7, except that the slurry was cast by pouring the slurry into a plaster mold having an inside diameter of 50 mm and then placing the slurry in a magnetic field of 12 T for 8 hours. The resulting sintered body was processed as in Experimental example A1 to produce an oriented alumina substrate. The properties thereof were measured. Table 1 lists the properties of the oriented alumina substrate.

Experimental Example A9

An alumina sintered body was produced as in Experimental example A4, except that the method for forming the one-surface processed body described in Experimental example A1 was changed as described below.

In Experimental example A9, the one-surface processed body was formed as follows: A commercially available plate-like alumina powder (grade: YFA10030, available from Kinsei Matec Co., Ltd.) was classified with an air classifier (TC-15N, available from Nisshin Engineering Inc.) at a cut-off point of 3 µm. The classified powder was subjected to disintegration with a pot disintegrator using balls having a diameter of 0.3 mm for 20 hours. A fine powder was then removed by elutriation. Next, 100 parts by mass of poly(vinyl butyral) (item No. BLS, available from Sekisui Chemical Co., Ltd.) serving as a binder and 3,500 parts by mass of terpineol serving as a dispersant were added to 100 parts by mass of the resulting plate-like alumina powder to provide a printing paste. The printing paste was applied by printing to one surface of the fine-alumina-powder layer with an emulsion-coated screen (ST640 mesh, emulsion thickness: 5 µm) to form the one-surface processed body. In this case, the plate-like-alumina-powder layer had a thickness of 0.5 µm. The resulting sintered body was processed as in Experimental example A1 to produce an oriented alumina substrate. The properties thereof were measured. Table 1 lists the properties of the oriented alumina substrate.

Experimental Example B1

(1) Production of Substrate for Light-Emitting Device (Substrate S1 for Device)
(1a) Formation of Seed Crystal Layer A seed crystal layer was formed by MOCVD on the oriented alumina substrate produced in Experimental example A1. Specifically, after a low-temperature GaN layer was deposited to a thickness of 40 nm at 530° C., a GaN film having a thickness of 3 µm was stacked at 1,050° C. to form a seed crystal substrate.

(1b) Formation of GaN Buffer Layer by Na Flux Method

The seed crystal substrate formed in the foregoing step was placed on the bottom portion of a cylindrical, flat-bottomed alumina crucible having an inside diameter of 80 mm and a height of 45 mm. A melt composition was charged into the crucible in a glove box. The composition of the melt composition is described below.

Metallic Ga: 60 g
Metallic Na: 60 g

The alumina crucible was placed in a refractory metal container, sealed, and placed on a rotatable stage of a crystal growth furnace. After the temperature and pressure were increased to 870° C. and 4.0 MPa in a nitrogen atmosphere, gallium nitride crystals were grown as a buffer layer while the solution was stirred by rotation of the alumina crucible with the temperature and pressure maintained for 10 hours. After the crystal growth was completed, the temperature was gradually lowered to room temperature over a period of 3 hours, and the growth container was removed from the crystal growth furnace. The melt composition left in the crucible was removed with ethanol to recover a sample including the gallium nitride crystals grown. In the sample, the gallium nitride crystals were grown on the entire surface of the seed crystal substrate having a diameter of 50 mm. The crystals had a thickness of about 0.1 mm. No crack was observed.

The resulting gallium nitride crystals on the oriented alumina substrate were fixed to a ceramic surface plate together with the substrate. The surface of the gallium nitride crystals was ground with grindstones of #600 and #2,000 to flatten the surface. The surface of the gallium nitride crystals was smoothed by lapping with a diamond abrasive. The surface smoothness was improved by reducing the size of the abrasive grains from 3 µm to 0.1 µm in a stepwise manner. The surface of the gallium nitride crystals after the process had an average roughness Ra of 0.2 nm. Thereby, a substrate in which the gallium nitride crystal layer having a thickness of about 50 µm was arranged on the oriented alumina substrate was produced. In this example, the gallium nitride buffer layer was formed in order to increase the crystallinity of a functional layer for the emission of light described below. However, the buffer layer itself may be omitted, depending on target properties and applications. The gallium nitride buffer layer may be doped with, for example, germanium, silicon, or oxygen to form a conductive structure.

(1c) Formation of Functional Layer for the Emission of Light by MOCVD Method

An n-GaN layer, serving as an n-type layer, doped with Si in a Si atom concentration of $5 \times 10^{18}$/cm$^3$ was deposited to a thickness of 3 µm by an MOCVD method on the substrate at 1,050° C. Multiple quantum well layers serving as active layers were deposited at 750° C. Specifically, five well layers and six barrier layers were alternately stacked, the well layers being composed of InGaN and having a thickness of 2.5 nm, the barrier layers being composed of GaN and having a thickness of 10 nm. Next, p-GaN, serving as a p-type layer, doped with Mg in a Mg atom concentration of $1 \times 10^{19}/\text{cm}^3$ was deposited to a thickness of 200 nm at 950° C. The substrate was removed from an MOCVD apparatus and subjected to heat treatment, serving as treatment for activating Mg ions in the p-type layer, at 800° C. for 10 minutes in a nitrogen atmosphere to provide a substrate for a light-emitting device.

(2) Production of Horizontal Light-Emitting Device

A portion of the resulting substrate for a light-emitting device on the side of the functional layer for the emission of light was processed by a photolithography process and an RIE method to expose a portion of the n-type layer. Subsequently, Ti/Al/Ni/Au films, serving as a cathode electrode, 15 nm, 70 nm, 12 nm, and 60 nm, respectively, in thickness were formed by patterning on the exposed portion of the n-type layer using a photolithography process and a vacuum deposition method. To improve the ohmic contact properties, heat treatment was performed at 700° C. for 30 seconds in a nitrogen atmosphere. Next, Ni/Au films, serving as an optical translucent anode electrode, 6 nm and 12 nm, respectively, in thickness were formed by patterning on the p-type layer using a photolithography process and a vacuum deposition method. To improve the ohmic contact properties, heat treatment was performed at 500° C. for 30 seconds in a nitrogen atmosphere. Then Ni/Au films, to be formed into an anode electrode pad, 5 nm and 60 nm, respectively, in thickness were formed by patterning on a region of the upper surface of the Ni/Au films serving as the optical translucent anode electrode using a photolithography process and a vacuum deposition method. The resulting wafer was cut into a chip. The chip is mounted on a lead frame to provide a light-emitting device having a horizontal structure.

Experimental Examples B2 to B9

Substrates for light-emitting devices were produced in the same way as in Experimental example B1 using the oriented alumina substrates of Experimental examples A2 to A9. Light-emitting devices having a horizontal structure were produced in the same way as in Experimental example B1.

[Evaluation of Light-Emitting Device]

For each of the horizontal light-emitting devices produced in Experimental examples B1 to B9, I-V measurement was performed by passing a current between the cathode electrode and the anode electrode. It was found that all samples had rectifying properties. When a forward current was passed, the emission of light having a wavelength of 450 nm was observed in all samples. Regarding the luminance of emitted light, the devices of Experimental examples B1, B2, and B9 were significantly high in luminance. The devices produced by the use of the substrates of Experimental examples B3 and B7 were also high in luminance, but were slightly lower in luminance than those in Experimental examples B1, B2, and B9. The device produced by the use of the substrate of Experimental example B8 was also high in luminance, but was slightly lower in luminance than those in Experimental examples B3 and B7. The device of Experimental example B4 was significantly lower in luminance than that in Experimental example B8. The devices of Experimental examples B5 and B6 were further lower in luminance than that in Experimental example B4.

Experimental Example C1

(1) Production of Substrate for Light-Emitting Device (Substrate S2 for Device)

(1a) Formation of Seed Crystal Layer

A seed crystal layer was formed by an MOCVD method on the oriented alumina substrate produced in Experimental example A1. Specifically, after a low-temperature GaN layer serving as a buffer layer was deposited to a thickness of 30 nm at a susceptor temperature of 530° C. in a hydrogen atmosphere, the susceptor temperature was raised to 1,050° C. in a nitrogen-hydrogen atmosphere, and a GaN film having a thickness of 3 μm was stacked, thereby providing a seed crystal layer.

(1b) Formation of Ge-Doped GaN Layer by Na Flux Method

The seed crystal substrate formed in the foregoing step was placed on the bottom portion of a cylindrical, flat-bottomed alumina crucible having an inside diameter of 80 mm and a height of 45 mm. A melt composition was charged into the crucible in a glove box. The composition of the melt composition is described below.

Metallic Ga: 60 g
Metallic Na: 60 g
Germanium tetrachloride: 1.85 g

The alumina crucible was placed in a refractory metal container, sealed, and placed on a rotatable stage of a crystal growth furnace. After the temperature and pressure were increased to 870° C. and 3.5 MPa in a nitrogen atmosphere, gallium nitride crystals were grown while the solution was stirred by rotation of the solution with the temperature and pressure maintained for 100 hours. After the crystal growth was completed, the temperature was gradually lowered to room temperature over a period of 3 hours, and the growth container was removed from the crystal growth furnace. The melt composition left in the crucible was removed with ethanol to recover a sample including the gallium nitride crystals grown. In the sample, the Ge-doped gallium nitride crystals were grown on the entire surface of the seed crystal substrate having a diameter of 50 mm. The crystals had a thickness of about 1.4 mm. No crack was observed. The oriented alumina substrate portion of the resulting sample was removed by grinding with a grindstone to provide Ge-doped gallium nitride alone. A surface of the Ge-doped gallium nitride crystals was polished to flatten the surface. The surface was smoothed by lapping and CMP to provide a self-supporting Ge-doped polycrystalline gallium nitride substrate, serving as a substrate for a light-emitting device, having a thickness of about 500 μm. The surface of the self-supporting polycrystalline gallium nitride substrate after the process had an average roughness Ra of 0.2 nm.

In this example, the n-type semiconductor was formed by doping gallium nitride with germanium. However, the gallium nitride may be doped with a different element or need not be doped, depending on applications and structures.

(2) Production of Light-Emitting Device

An n-GaN layer, serving as an n-type layer, doped with Si in a Si atom concentration of $5 \times 10^{18}/\text{cm}^3$ was deposited to a thickness of 1 μm by an MOCVD method at 1,050° C. on the self-supporting Ge-doped polycrystalline gallium nitride substrate produced in Experimental example C1. Multiple quantum well layers serving as light-emitting layers were deposited at 750° C. Specifically, five well layers and six barrier layers were alternately stacked, the well layers being composed of InGaN and having a thickness of 2.5 nm, the barrier layers being composed of GaN and having a thickness of 10 nm. Next, p-GaN, serving as a p-type layer, doped with Mg in a Mg atom concentration of $1 \times 10^{19}/\text{cm}^3$ was deposited to a thickness of 200 nm at 950° C. The substrate was removed from an MOCVD apparatus and subjected to heat treatment, serving as treatment for activating Mg ions in the p-type layer, at 800° C. for 10 minutes in a nitrogen atmosphere.

Next, Ti/Al/Ni/Au films, serving as a cathode electrode, 15 nm, 70 nm, 12 nm, and 60 nm, respectively, in thickness were formed by patterning using a photolithography process and a vacuum deposition method on a surface of the self-supporting polycrystalline gallium nitride substrate opposite the side adjacent to the n-GaN layer and the p-GaN layer. To improve the ohmic contact properties, heat treatment was performed at 700° C. for 30 seconds in a nitrogen atmosphere. Then Ni/Au films, serving as an optical translucent anode electrode, 6 nm and 12 nm, respectively, in thickness were formed by patterning on the p-type layer using a photolithography process and a vacuum deposition method. To improve the ohmic contact properties, heat treatment was performed at 500° C. for 30 seconds in a nitrogen atmosphere. Subsequently, Ni/Au films, to be formed into an anode electrode pad, 5 nm and 60 nm, respectively, in thickness were formed by patterning on a region of the upper surface of the Ni/Au films serving as the optical translucent anode electrode using a photolithography process and a vacuum deposition method. The resulting wafer was cut into a chip. The chip is mounted on a lead frame to provide a light-emitting device having a vertical structure.

Experimental Examples C2 to C9

In Experimental examples C2 to C9, substrates for light-emitting devices were produced in the same way as in Experimental example C1 using the oriented alumina substrates of Experimental examples A2 to A9. Light-emitting devices having a vertical structure were produced in the same way as in Experimental example C1.

[Evaluation of Light-Emitting Device]

For each of the vertical light-emitting devices produced in Experimental examples C1 to C9, I-V measurement was performed by passing a current between the cathode electrode and the anode electrode. It was found that all samples had rectifying properties. When a forward current was passed, the emission of light having a wavelength of 450 nm was observed in all samples. Regarding the luminance of emitted light, the devices of Experimental examples C1, C2, and C9 were significantly high in luminance. The devices produced by the use of the substrates of Experimental examples C3 and C7 were also high in luminance, but were slightly lower in luminance than those in Experimental examples C1, C2, and C9. The device produced by the use of the substrate of Experimental example C8 was also high in luminance, but was slightly lower in luminance than those in Experimental examples C3 and C7. The device of Experimental example C4 was significantly lower in luminance than that in Experimental example C8. The devices of Experimental examples C5 and C6 were further lower in luminance than that in Experimental example C4.

Among the foregoing Experimental examples, Experimental examples A1 to A3 and A7 to A9 correspond to examples of the present invention. Experimental examples A4 to A6 correspond to comparative examples. The present invention is not particularly limited to the foregoing examples. It will be obvious that various modifications may be made within the technical scope of the present invention.

The present application claims priority from Japanese Patent Application No. 2016-139508 filed on Jul. 14, 2016, Japanese Patent Application No. 2016-66431 filed on Mar. 29, 2016, Japanese Patent Application No. 2016-34005 filed on Feb. 25, 2016, Japanese Patent Application No. 2016-11190 filed on Jan. 25, 2016, Japanese Patent Application No. 2015-224164 filed on Nov. 16, 2015, Japanese Patent Application No. 2015-193943 filed on Sep. 30, 2015, and Japanese Patent Application No. 2015-193944 filed on Sep. 30, 2015, the entire contents of which are incorporated herein by reference.

What is claimed is:

1. An oriented alumina substrate for epitaxial growth, comprising:
    alumina crystalline grains constituting a surface of the oriented alumina substrate,
    the alumina crystalline grains having a tilt angle of 0.4° to 0.98° and an average sintered grain size of 10 μm or more.

2. The oriented alumina substrate for epitaxial growth according to claim 1,
    wherein the alumina crystalline grains constituting the surface of the oriented alumina substrate have an average sintered grain size of 20 μm or more.

3. The oriented alumina substrate for epitaxial growth according to claim 1, wherein the content of each of Na, Mg, Si, P, Ca, Fe, Ti, and Zn is 1,500 ppm or less.

4. The oriented alumina substrate for epitaxial growth according to claim 2, wherein the content of each of Na, Mg, Si, P, Ca, Fe, Ti, and Zn is 1,500 ppm or less.

5. The oriented alumina substrate for epitaxial growth according to claim 1, wherein the content of Mg is 15 ppm or more.

6. The oriented alumina substrate for epitaxial growth according to claim 2, wherein the content of Mg is 15 ppm or more.

7. The oriented alumina substrate for epitaxial growth according to claim 3, wherein the content of Mg is 15 ppm or more.

8. The oriented alumina substrate for epitaxial growth according to claim 4, wherein the content of Mg is 15 ppm or more.

* * * * *